(12) United States Patent  
Chang et al.

(10) Patent No.: US 9,236,570 B2  
(45) Date of Patent: Jan. 12, 2016

(54) RESISTIVE MEMORY CELL ARRAY WITH TOP ELECTRODE BIT LINE

(71) Applicant: Taiwan Semiconductor Manufacturing Company, Ltd., Hsin-Chu (TW)

(72) Inventors: Chih-Yang Chang, Hsin-Chu (TW); Wen-Ting Chu, Hsin-Chu (TW); Kuo-Chi Tu, Hsin-Chu (TW); Hsia-Wei Chen, Hsin-Chu (TW); Yu-Wen Liao, Hsin-Chu (TW); Chin-Chieh Yang, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/617,499

(22) Filed: Feb. 9, 2015

(65) Prior Publication Data

US 2015/0155488 A1    Jun. 4, 2015

Related U.S. Application Data

(63) Continuation of application No. 13/791,659, filed on Mar. 8, 2013, now Pat. No. 8,952,347.

(51) Int. Cl.
*H01L 47/00* (2006.01)
*H01L 45/00* (2006.01)
*H01L 27/24* (2006.01)

(52) U.S. Cl.
CPC ........ *H01L 45/1666* (2013.01); *H01L 27/2463* (2013.01); *H01L 45/04* (2013.01); *H01L 45/1233* (2013.01); *H01L 45/1253* (2013.01); *H01L 45/145* (2013.01); *H01L 45/146* (2013.01); *H01L 45/16* (2013.01); *H01L 45/1675* (2013.01); *Y10S 438/90* (2013.01)

(58) Field of Classification Search
None
See application file for complete search history.

(56) References Cited

U.S. PATENT DOCUMENTS

| | | | |
|---|---|---|---|
| 6,677,637 B2 | 1/2004 | Bernstein et al. |
| 6,737,728 B1 | 5/2004 | Block et al. |
| 6,781,185 B2 | 8/2004 | Chen et al. |
| 6,803,641 B2 | 10/2004 | Papa Rao et al. |
| 6,849,891 B1 | 2/2005 | Hsu et al. |
| 6,936,881 B2 | 8/2005 | Yeo et al. |
| 6,937,457 B2 | 8/2005 | Shih et al. |
| 6,940,705 B2 | 9/2005 | Yeo et al. |
| 7,195,970 B2 | 3/2007 | Tu et al. |
| 7,407,858 B2 | 8/2008 | Li et al. |
| 7,557,399 B2 | 7/2009 | Tu et al. |
| 8,000,128 B2 | 8/2011 | Li et al. |
| 8,009,454 B2 | 8/2011 | Lee et al. |
| 2011/0220863 A1 | 9/2011 | Mikawa et al. |
| 2014/0252297 A1 | 9/2014 | Chang et al. |

OTHER PUBLICATIONS

Chinese Office Action issued in Patent Application No. 103101928 on May 7, 2015.

*Primary Examiner* — Marvin Payen  
(74) *Attorney, Agent, or Firm* — Haynes and Boone, LLP (57) ABSTRACT

A method for forming a resistive memory cell within a memory array includes forming a patterned stopping layer on a first metal layer formed on a substrate and forming a bottom electrode into features of the patterned stopping layer. The method further includes forming a resistive memory layer. The resistive memory layer includes a metal oxide layer and a top electrode layer. The method further includes patterning the resistive memory layer so that the top electrode layer acts as a bit line within the memory array and a top electrode of the resistive memory cell.

20 Claims, 6 Drawing Sheets

RESISTIVE MEMORY CELL ARRAY WITH TOP ELECTRODE BIT LINE

PRIORITY INFORMATION

This application is a continuation of U.S. patent application Ser. No. 13/791,659 filed Mar. 8, 2013 and entitled "Resistive Memory Cell Array with Top Electrode Bit Line," the disclosure of which is hereby incorporated by reference in its entirety.

BACKGROUND

There is a frequent demand for smaller devices with more memory. Some efforts have been initiated in resistive memory as a mechanism for creating more memory in less space. Resistive memory systems use a resistive element that can change and maintain the value of its resistivity based on applied electrical conditions. Resistive memory systems use a resistive element that can change and maintain the value of its resistivity based on applied conditions. An example of such a resistive switching device is a metal-insulator-metal device.

A metal-insulator-metal device can be set to a low resistive state when certain electrical conditions form a current path through the insulator material. Alternatively, the device can be set to a high resistive state when this certain applied electrical conditions break this path. Of practical importance, a metal-insulator-metal device can be used to represent logical values. For example, a high resistive state may be used to represent a logical '1' while a low resistive state may be used to represent a logical '0'.

Resistive memory systems are often constructed as an array of resistive memory cells, with each cell being placed on intersecting conductive lines. Typically, such an array is formed in several layers. There is a layer for the bottom conductive lines, a layer for the bottom electrodes of the resistive memory cell, a layer for the insulator portion of the resistive switching device, a layer for the top electrode of the resistive switching device, and a layer for the top intersecting conductive lines. Each of these layers is specifically formed through standard photolithographic patterning processes. It is desirable, however, to be able to fabricate such memory arrays in as few steps as possible.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIGS. 1A-1G are diagrams showing an illustrative process for forming a resistive memory cell having a top electrode that acts as a bit line. FIGS. 1A-1G also illustrate the formation of logic circuitry associated with the memory cell being formed. Specifically, the left side of the diagrams show the memory cell 100 while the right side of the diagrams show the logic portion 102.

Figure 1A:
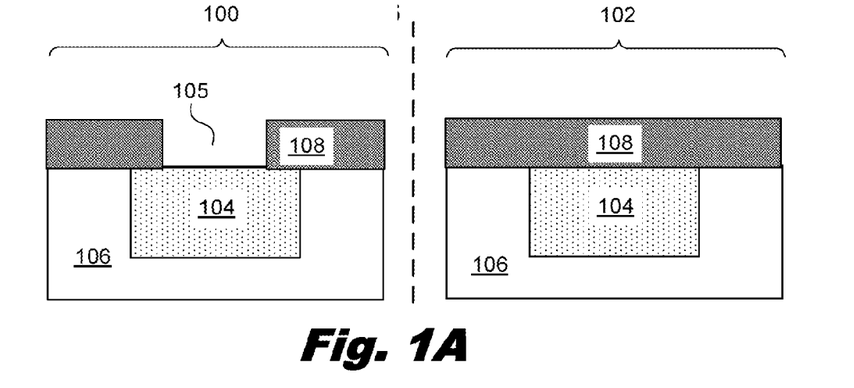
FIGS. 1A-1G are diagrams showing an illustrative process for forming a resistive memory cell having a top electrode that acts as a bit line, according to one example of principles described herein.

FIG. 1A illustrates the formation of a stopping layer 108 on a substrate 106. The substrate has a first metal layer 104 formed thereon. The first metal layer 104 includes a number of conductive elements such as contacts and lines that form part of a memory array. The substrate 106 may be made of a semiconductor material such as silicon. The metal layer 104 may be made of standard electrically conductive materials.

The stopping layer 108 is used to act as a barrier between the metal layer 104 and a resistive memory cell. The stopping layer 108 may be made from a variety of materials including, but not limited to, silicon carbide (SiC), silicon oxynitride (SiON), and silicon nitride ($Si_3N_4$). The stopping layer 108 is patterned so as to form a bottom electrode via 105. The bottom electrode via 105 is positioned over a conductive element of the metal layer 104 where a resistive memory cell is to be formed. At other locations, such as where a logic element 102 is to be formed, the stopping layer 108 is left intact. The bottom electrode via 105 allows for the formation of a bottom electrode.

The bottom electrode via 105 may be formed through a variety of methods. For example, a photoresist material may be applied to the stopping layer 108. The photoresist material may then be exposed to a light source through a mask. The exposed photoresist material can then be developed away. Standard etching processes may then be used to form bottom electrode vias 105 at regions not protected by the remaining photoresist material.

Figure 1B:
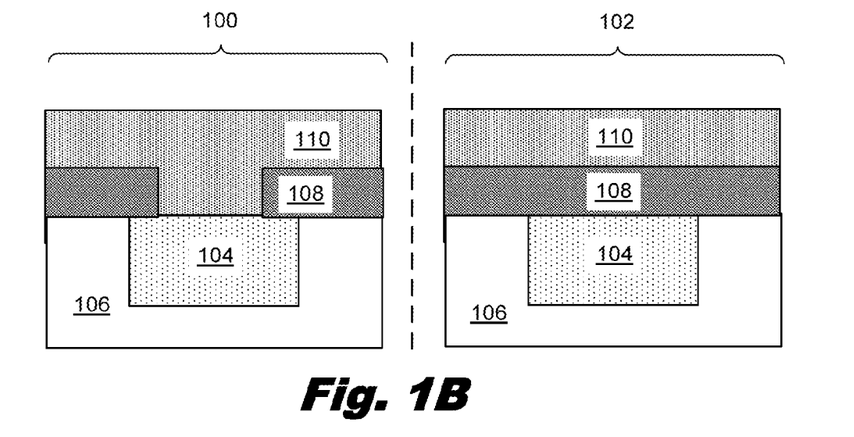

FIG. 1B illustrates the formation of a bottom electrode layer 110. In the present example, a conductive material used to form a bottom electrode is deposited over the stopping layer 108. The bottom electrode layer 110 is deposited over the entire array, including over locations where resistive memory cells 100 will be formed and where logic elements 102 will be formed. Thus, the bottom electrode via 105 gets filled with the bottom electrode layer material. The bottom electrode layer 110 may be made of a variety of materials including, but not limited to, tantalum nitride (TaN), titanium nitride (TiN), tungsten (W) and copper (Cu).

Figure 1C:
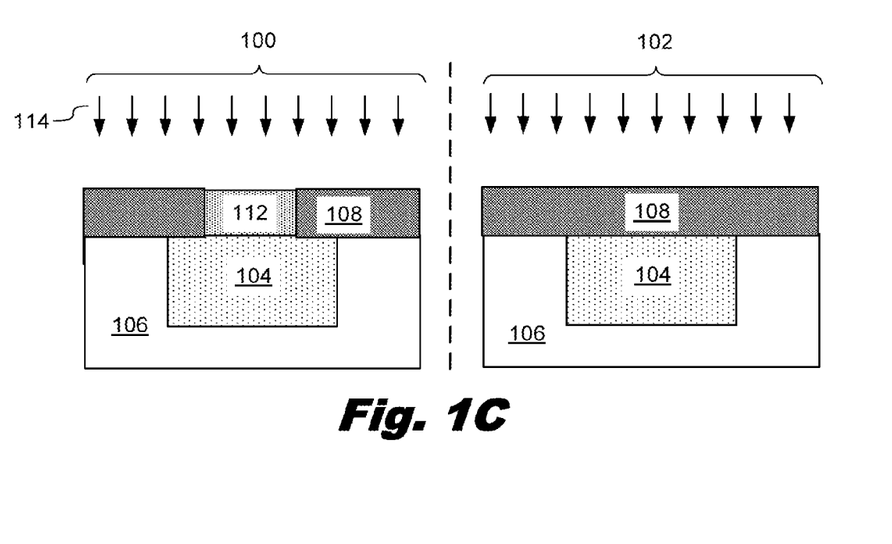

FIG. 1C illustrates a removal process 114 that removes the bottom electrode layer 110 down to the stopping layer 108. This leaves the final bottom electrode 112 within the bottom electrode via 105. In some examples, the removal process 114 may be a Chemical Mechanical Polishing (CMP) process.

Figure 1D:
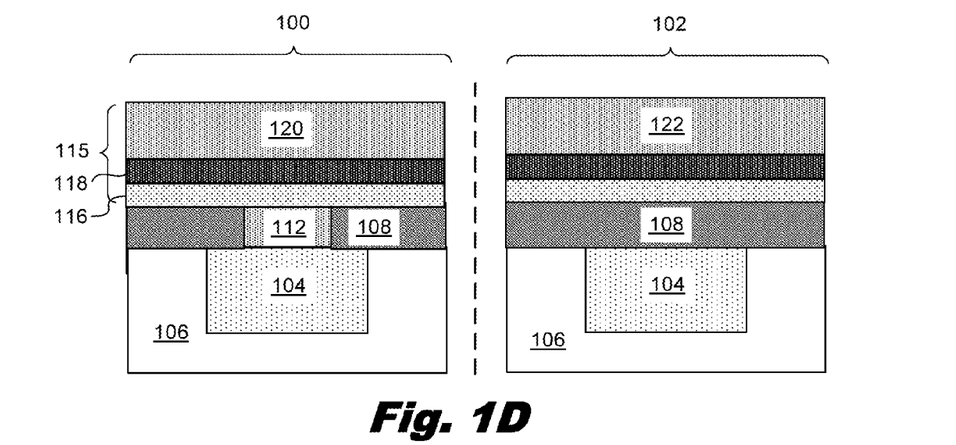

FIG. 1D illustrates the formation of a resistive memory layer 115. The resistive memory layer 115 includes a metal oxide layer 116, a capping layer 118, and a top electrode layer 120. The resistive memory layer 115 is used to form the memory element 121 of the resistive memory cell 100. The resistive state of materials between the bottom electrode 112 and the top electrode 120 will change based on applied electrical conditions. For example, an applied voltage may form a current path through the metal oxide layer 116 through which electric current will flow. This puts the memory cell in a low resistive state. A voltage of opposite polarity can be used to break the current path through the metal oxide layer 116. This puts the memory cell 102 in a high resistive state. The different resistive states can represent different logical values. For example, a high resistive state may represent a logical '0' while a low resistive state may represent a logical '1'.

The metal oxide layer 116 may be made from a variety of oxide materials including, but not limited to, hafnium oxide ($HfO_2$), zirconium oxide ($ZrO_2$), aluminum oxide ($Al_2O_3$), nitric oxide (NO), tantalum oxide ($Ta_2O_5$), and titanium oxide (TiO). The capping layer 118 may be made from a variety of materials including, but not limited to, titanium (Ti), hafnium (Hf), platinum (Pt), and tantalum (Ta). The top electrode layer 120 may be made from a variety of materials including, but not limited to tantalum nitride (TaN), titanium nitride (TiN), and platinum (Pt).

Figure 1E:
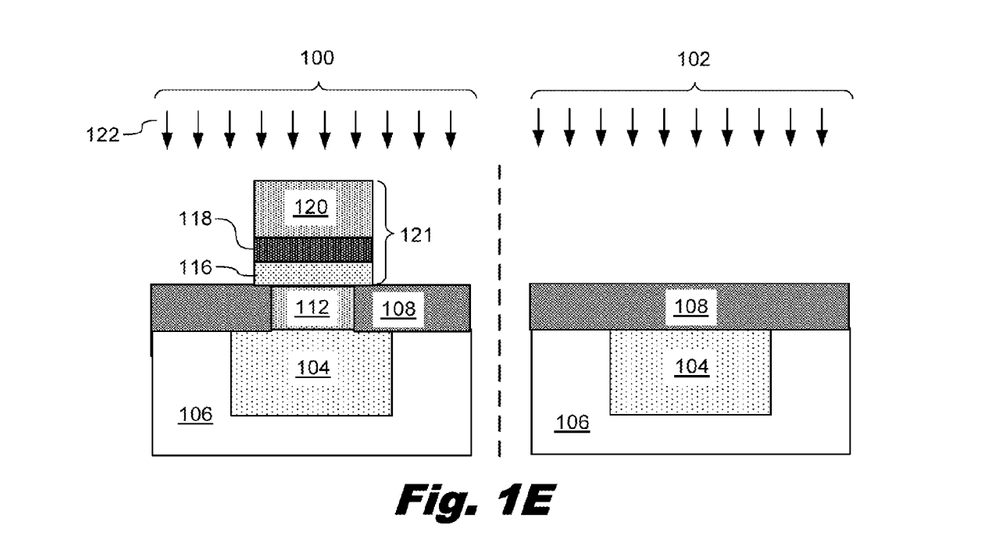

FIG. 1E is a diagram showing an illustrative patterning process 122 used to pattern the resistive memory layer 115. According to the present example, the resistive memory layer 115 is patterned so that a resistive memory cell is formed over the bottom electrode 112. For logic elements 102, the resistive memory layer 115 can be removed entirely. Additionally, the patterning is such that the top electrode 120 also acts as a bit line.

Memory arrays are typically arranged in rows and columns. Each memory cell is interconnected through a set of bit lines that run perpendicular to a set of word lines. The source line also typically runs parallel to the word line. A word line driver will selectively assert a word line, which is connected to a row of memory cells each storing a bit of information. When a word line is asserted, each of the connected memory cells provides its stored bit of information on one or more bit lines. The bit lines are provided to sense amplifiers, which are used to select one or more columns of the array and amplify the stored bit(s) of information accordingly.

Various processes may be used to pattern the resistive memory layer 115. For example, a photoresist material may be applied and then exposed to a light source through a mask. The exposed photoresist material can then be developed away. Standard etching processes may then be used to remove portions of the resistive memory layer 115 that are not protected by the remaining photoresist material.

Figure 1F:
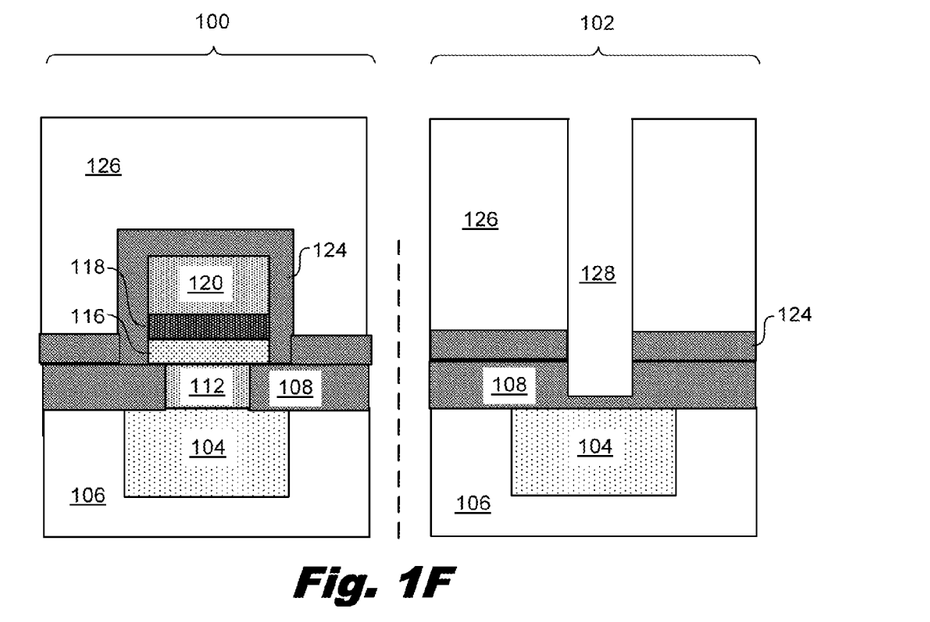

FIG. 1F is a diagram showing the deposition of an additional stopping layer 124 around the memory element 121 of the resistive memory cell 100. Additionally, an interlayer dielectric layer 126 is deposited onto the stopping layer 108 and additional stopping layer 124 that covers the memory element 121. The interlayer dielectric layer 126 electrically isolates the lower metal layer 104 from any components formed within an additional layer.

For logic components 102 where a connection between an upper layer and the lower metal layer 104 are desired, a via 128 can be formed through the interlayer dielectric layer 126. Various photolithographic processes may be used to form the via 128. For example, a photoresist material may be applied and then exposed to a light source through a mask. The exposed photoresist material can then be developed away. Standard etching processes may then be used to form vias 128 at regions not protected by the remaining photoresist material.

Figure 1G:
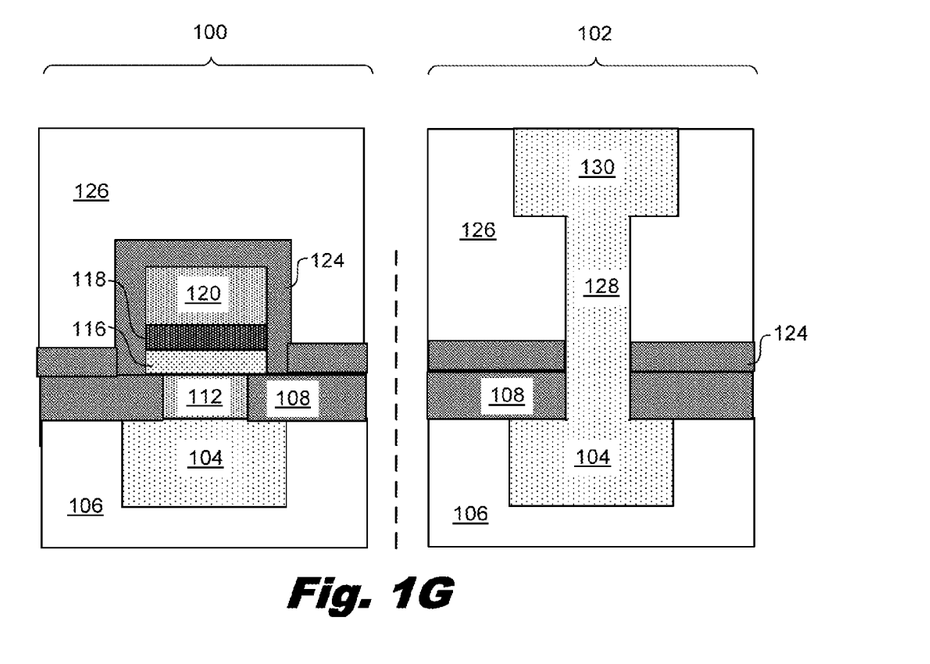

FIG. 1G illustrates the formation of an additional metal layer 130. During the process of forming the additional metal layer 130, the via is filled with the metal material so as to form an electrical connection between the first metal layer 104 and the additional metal layer 130. The logic element 102 illustrated is part of the logic circuitry used to connect various components formed within a substrate to each other through metal lines formed on the various metal layers. Specifically, the various resistive memory cells formed throughout the substrate are interconnected to form the memory array.

Through use of the processes described above, a resistive memory array can be formed using two masks. Specifically, one mask is used to pattern the bottom electrode vias 105 into the stopping layer 108. The other mask is used to pattern the resistive memory layer 115. Because the top electrode layer 120 of the resistive memory layer 115 acts as both a top electrode and a bit line, an additional mask to form the top electrode is not used.

Figure 2:
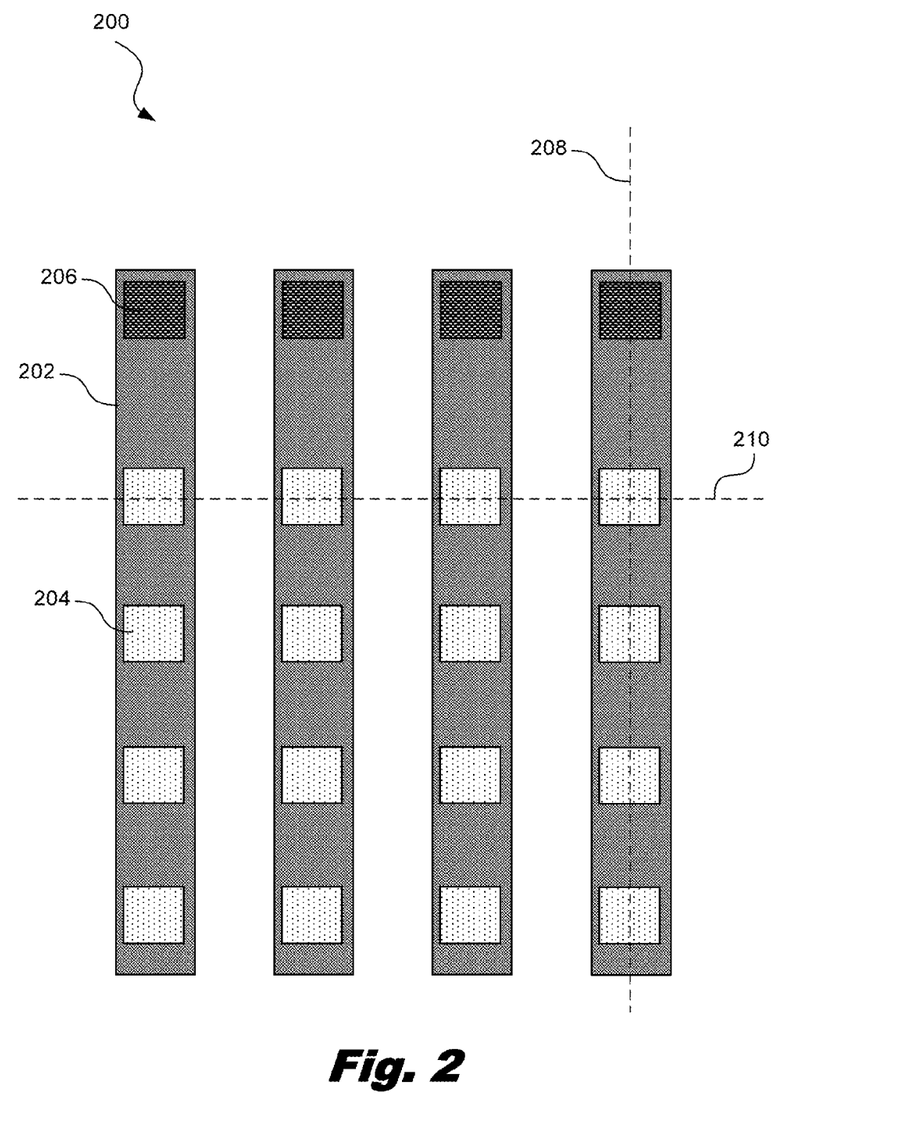
FIG. 2 is a diagram showing an illustrative top view of a memory cell having a top electrode that acts as a bit line, according to one example of principles described herein.

FIG. 2 is a diagram showing an illustrative top view of a memory array 200 with memory cells having a top electrode that acts as a bit line. The memory array 200 of FIG. 2 is a simple 4×4 memory array for illustrative purposes. A practical array embodying principles described herein may have a much larger number of memory cells within the array.

According to the present example, the patterned resistive memory layer is patterned such that the top electrode also acts as a bit line 202. Each bit line acts as a top electrode to multiple memory cells 204. At the end of each bit line 202, a logic pickup 206 is formed so as to connect the bit line to circuitry on another layer within the substrate.

As mentioned above, a memory array includes bit lines and word lines. The word lines run in a direction 210 that is perpendicular to the direction 208 in which the bit lines 202 run. The word lines may run in a layer underneath the bottom electrodes of the memory cells 204, such as the first metal layer 104 illustrated in FIGS. 1A-1G. By having the top electrode also act as a bit line, the memory array can be created with fewer masks.

Figure 3:
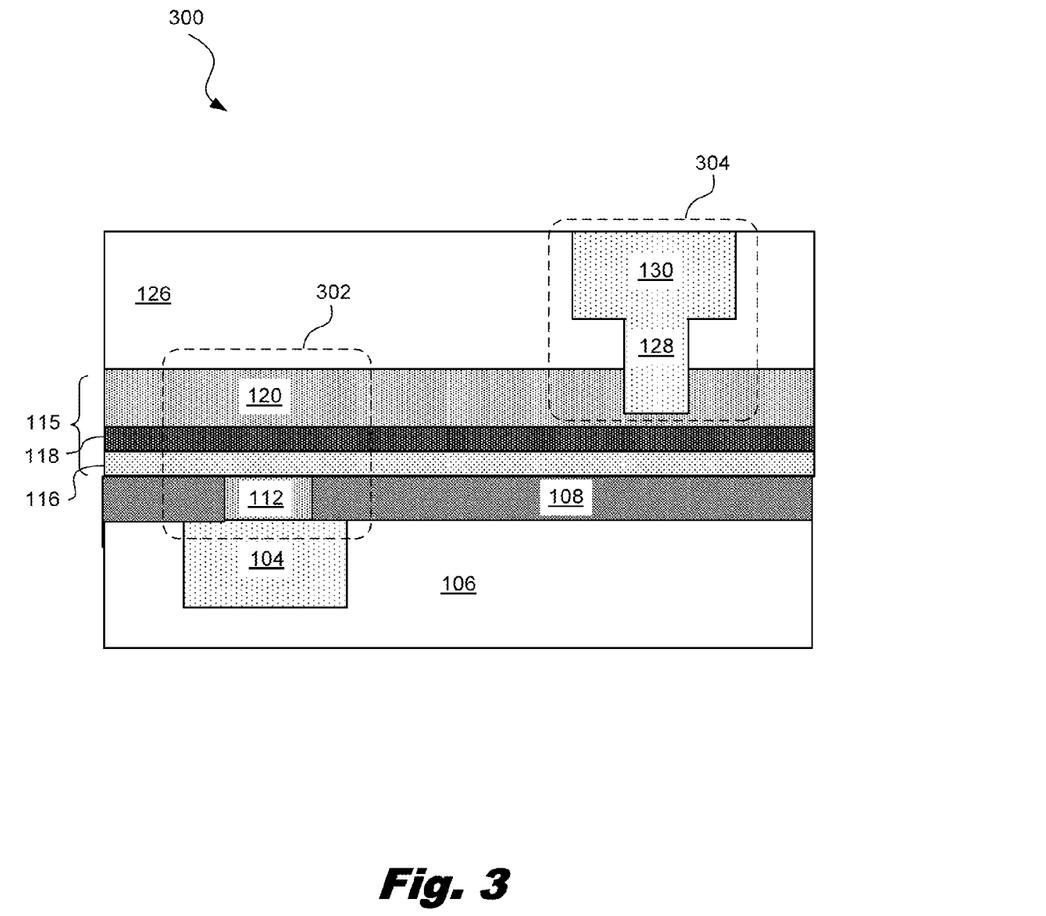
FIG. 3 is a diagram showing a cross-sectional view along a bit line that acts as a top electrode to multiple memory cells, according to one example of principles described herein.

FIG. 3 is a diagram showing a cross-sectional view along a bit line that acts as a top electrode 120 to multiple memory cells. Specifically, FIG. 3 is a cross-sectional view along the direction 208 illustrated in FIG. 2. According to the present example, the resistive memory layer 115 runs the entire length of the bit line. Thus, the bit line has the metal oxide layer 116 and capping layer 118 underneath.

Memory cells 302 exist where a bottom electrode 112 allows for application of a voltage between that bottom electrode 112 and the top electrode 120 to change the resistive state of the metal oxide layer 116 between the two electrodes. Additionally, a logic pickup 304 exists where a higher metal layer 130 connects to the top electrode 120 through a via 128.

Figure 4:
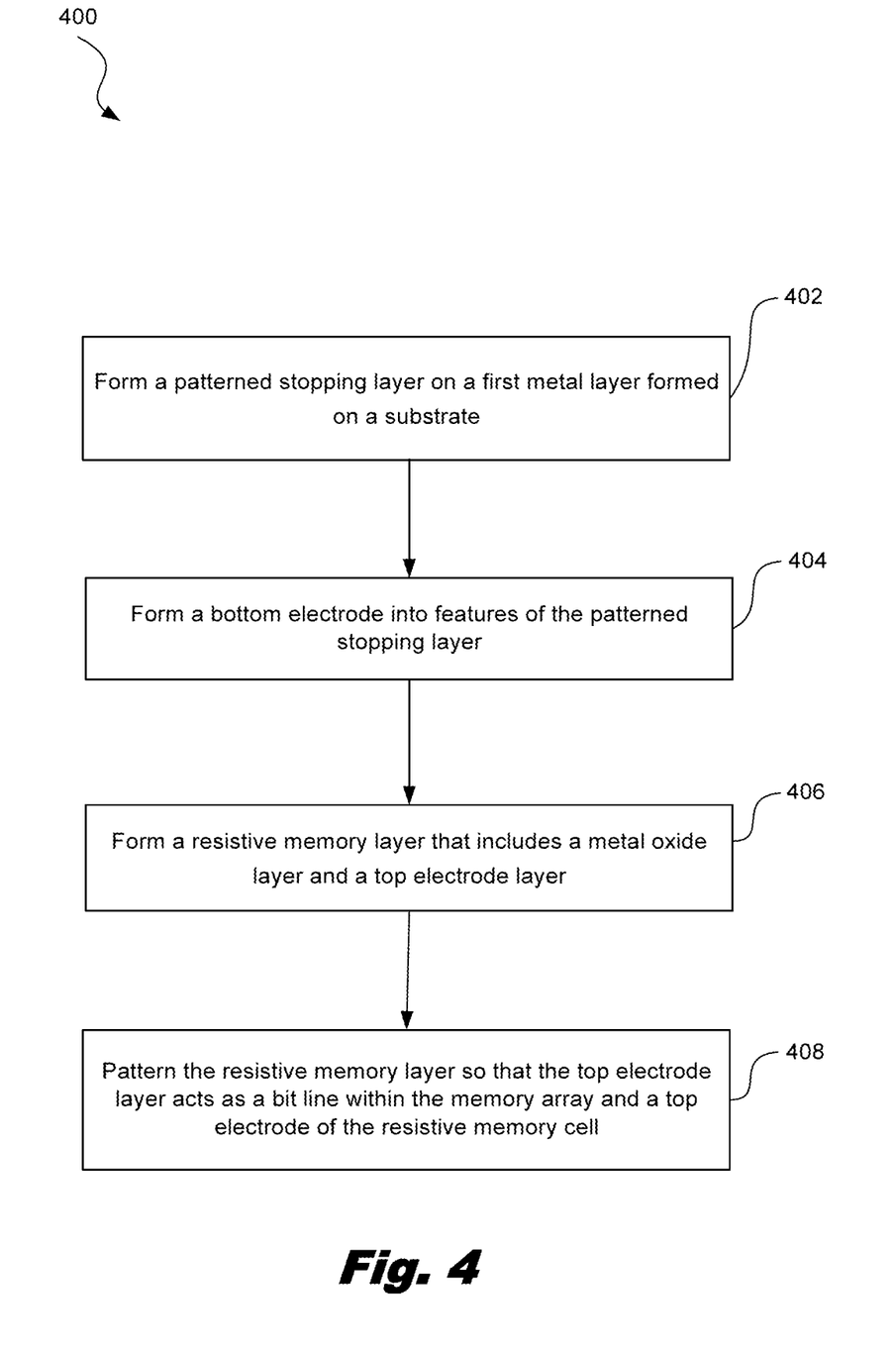
FIG. 4 is a flowchart showing an illustrative method for forming a resistive memory cell having a top electrode that acts as a bit line, according to one example of principles described herein.

FIG. 4 is a flowchart showing an illustrative method 400 for forming a resistive memory cell having a top electrode that acts as a bit line. According to certain illustrative examples, the method includes a step of forming 402 a patterned stopping layer on a first metal layer formed on a substrate. The method further includes a step of forming 404 a bottom electrode into features of the patterned stopping layer. The method further includes a step of forming 406 a resistive memory layer that includes a metal oxide layer and a top electrode layer. The method further includes a step of patterning 408 the resistive memory layer so that the top electrode layer acts as a bit line within the memory array and a top electrode of the resistive memory cell.

According to certain illustrative examples, a method for forming a resistive memory cell having a top electrode that acts as a bit line includes forming a patterned stopping layer on a first metal layer formed on a substrate, forming a bottom electrode into features of the patterned stopping layer, forming a resistive memory layer that includes a metal oxide layer and a top electrode layer, and patterning the resistive memory layer so that the top electrode layer acts as a bit line within the memory array and a top electrode of the resistive memory cell.

A memory cell device includes a first metal layer formed on a substrate, a stopping layer on the substrate, the stopping layer patterned such that a first via is formed in the stopping layer over a conductive element of the metal layer, a bottom electrode formed into the first via, and a resistive memory layer that includes a metal oxide layer and a top electrode layer. The resistive memory layer is patterned such that the top electrode layer acts as a bit line within the memory array and a top electrode of the memory cell.

A resistive switching memory array includes a first metal layer formed into a substrate, a stopping layer formed on the substrate, the stopping layer being patterned such that bottom electrode vias are formed for each memory cell within the array, and a patterned resistive memory layer that includes a metal oxide layer and a top electrode layer. The resistive memory layer is patterned such that the top electrode layer acts as both bit lines for the memory array and top electrodes for the resistive memory cells within the array.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A method for forming a resistive memory cell, the method comprising:
   forming a bottom electrode on a substrate;
   forming a resistive memory layer over at least a portion of the bottom electrode, the resistive memory layer including:
   a metal oxide layer; and
   a top electrode layer; and
   patterning the resistive memory layer so that the top electrode layer forms both a bit line within a memory array and a top electrode of the resistive memory cell.

2. The method of claim 1, further comprising:
   forming a patterned stopping layer having openings on a first metal layer formed on the substrate; and
   depositing an additional stopping layer on the patterned resistive memory layer.

3. The method of claim 2, further comprising, depositing an interlayer dielectric layer on the additional stopping layer.

4. The method of claim 3, further comprising, forming a second metal layer on the interlayer dielectric layer, the second metal layer connected to an underlying conductive element through a via.

5. The method of claim 4, wherein the conductive element comprises a conductive element of the first metal layer.

6. The method of claim 1, further comprising:
   forming a patterned stopping layer having an opening over features of a first metal layer corresponding to memory cells, the patterned stopping layer covering portions of the first metal layer corresponding to logic elements.

7. The method of claim 6, further comprising, forming bottom electrode material over the stopping layer over the conductive element of the logic element.

8. The method of claim 7, further comprising, removing the bottom electrode material over the conductive element of the logic element.

9. The method of claim 8, further comprising, forming the resistive memory layer over the conductive element of the logic element.

10. The method of claim 9, further comprising, removing the resistive memory layer over the conductive element of the logic element.

11. The method of claim 10, further comprising, forming an interlayer dielectric on top of the stopping layer above the conductive element of the logic element.

12. The method of claim 11, further comprising, forming a second metal layer on the stopping layer and a via from the second metal layer through the dielectric layer and stopping layer to the conductive element of the logic element.

13. A memory cell device comprising:
   a first metal layer formed on a substrate;
   a bottom electrode formed on the substrate, the bottom electrode in electrical contact with a feature of the first metal layer;
   a resistive memory layer over the bottom electrode, the resistive memory layer comprising:
   a metal oxide layer; and
   a top electrode layer;
   wherein the resistive memory layer is patterned such that features of the resistive memory layer form a bit line within a memory array and a top electrode of the memory cell.

14. The device of claim 13, wherein the bottom electrode is formed within an opening of a stopping layer formed on the substrate.

15. The device of claim 14, further comprising an interlayer dielectric layer disposed over the stopping layer.

16. The device of claim 15, further comprising, a via extending through the interlayer dielectric layer.

17. The device of claim 16, further comprising, a second metal layer on the interlayer dielectric layer, the second metal layer connected to an underlying conductive element through the via.

18. The device of claim 17, wherein the conductive element includes a conductive element of the first metal layer.

19. A resistive switching memory array comprising:
   a first metal layer formed into a substrate, the first metal layer comprising a bottom electrode;
   a patterned resistive memory layer over the bottom electrode, the patterned resistive memory layer comprising:
   a metal oxide layer; and
   a top electrode layer;
   wherein the resistive memory layer is patterned such that features of the patterned resistive memory layer form both bit lines for the memory array and top electrodes for resistive memory cells within the array.

20. The array of claim 19, further comprising:
   a first stopping layer formed on the substrate, the stopping layer being patterned such that bottom electrode vias are formed for each memory cell within the array;
   a second stopping layer on the patterned resistive memory layer;
   an interlayer dielectric layer on the second stopping layer;
   a second via formed through the interlayer dielectric layer; and
   a second metal layer on the interlayer dielectric layer, the second metal layer connected to a conductive element of the first metal layer.

* * * * *